Sept. 9, 1969 C. N. COLE 3,466,526
FREQUENCY TO D.-C. CONVERTER
Filed Jan. 5, 1968 2 Sheets-Sheet 1

INVENTOR.
CHARLES N. COLE
BY R H Quist
ATTORNEY.

INVENTOR.
CHARLES N. COLE
BY R. H. Quist
ATTORNEY.

United States Patent Office 3,466,526
Patented Sept. 9, 1969

3,466,526
FREQUENCY TO D.-C. CONVERTER
Charles N. Cole, Huntsville, Tex., assignor to General Electric Company, a corporation of New York
Filed Jan. 5, 1968, Ser. No. 695,953
Int. Cl. H02m 7/44
U.S. Cl. 321—8 4 Claims

ABSTRACT OF THE DISCLOSURE

A first capacitor is brought to a known voltage level during a first period of time. A first field effect transistor is used to connect the first capacitor to a constant current source for one cycle (or a multiple thereof) of an input signal. A second field effect transistor is then used to connect the first capacitor to a second capacitor, and the sequence is repeated. A high gain amplifier converts the input signal to a square wave which through logic circuitry is used to apply the necessary gating signals to the field effect transistors.

Background of the invention

This invention is a circuit for producing a direct current voltage proportional to the frequency of an alternating current signal particularly adaptable to large scale integrated circuitry techniques.

Various methods for achieving an indication of the frequency of an alternating current signal have previously been devised. Such prior art circuits are not suitable when the frequency of the signal is low since errors are introduced by current leakage. In addition, the requirement for a compact frequency measuring device utilizing large scale integrated circuit techniques cannot be met by these prior art devices.

Summary of the invention

It is an object of this invention to provide a frequency to D.-C. converter suitable for implementation by large scale integrated circuit techniques which minimizes error due to current leakage.

It is also an object of this invention to provide such a converter suitable for use with alternating currents of low frequency.

In a preferred form of the invention, the input signal is applied to a high gain limiting amplifier which produces a square wave output. This output is used to cause three field effect transistors to conduct in a sequential manner as follows: a first field effect transistor connects a first capacitor to a constant current source for a time equivalent to one full cycle of the input signal; a second field effect transistor connects the first capacitor to a second capacitor for the next half cycle of the input signal; and a third field effect transistor connects the first capacitor to ground for the next half cycle of the input signal.

Description of the preferred embodiment

Figure 1:
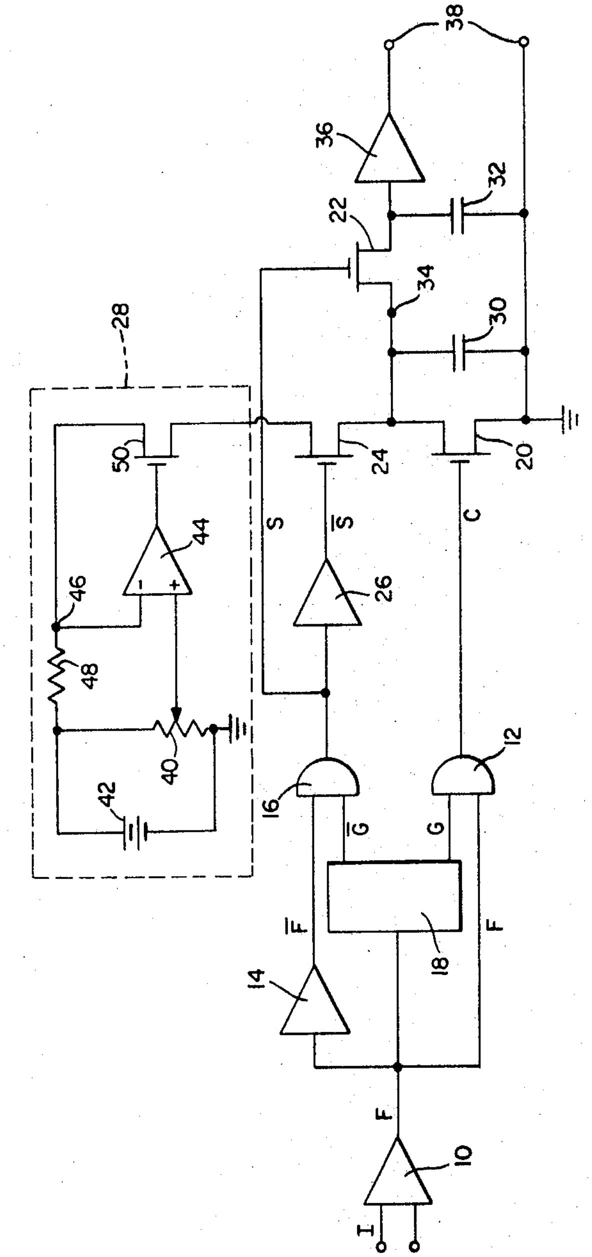
FIGURE 1 is a schematic circuit diagram of one embodiment of the invention.
Figure 2:
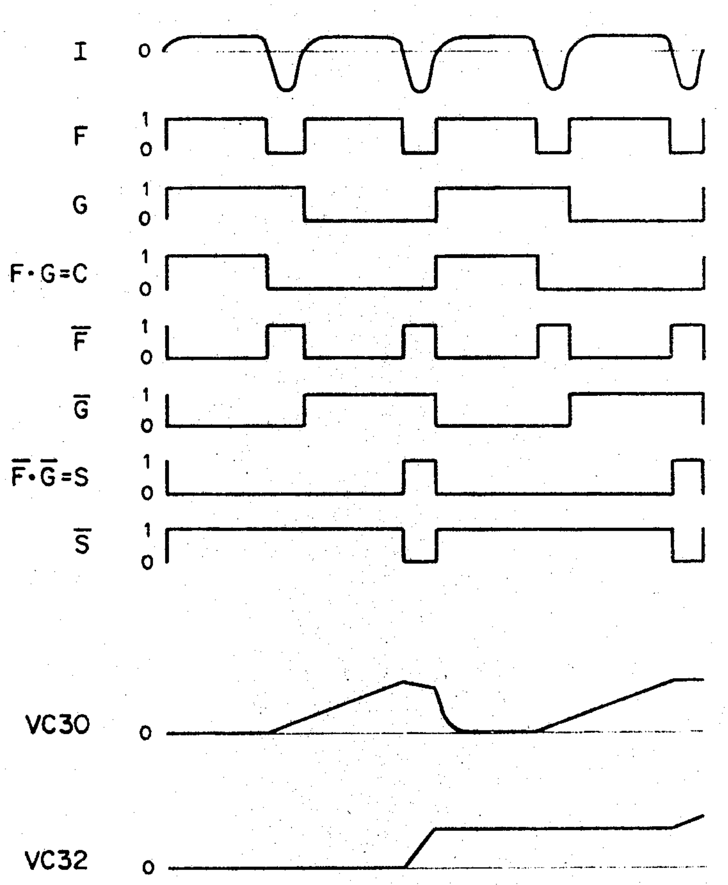
FIGURE 2 is a representation of voltages in various parts of the circuit of FIGURE 1.

The circuit of this invention is illustrated in FIGURE 1 with the waveforms at various points shown in FIGURE 2. The input signal (I in FIGURE 2) whose frequency is to be measured is applied to high gain limiting amplifier 10 which produces a square wave output (F) containing only the times of the waveform and the waveform mean value intersections, and not having amplitude relationships to the input waveform.

The output of amplifier 10 is transmitted directly as one input to AND gate 12. The amplifier output is also passed through inverter 14 and applied as one input ($\overline{F}$) to AND gate 16. In addition, the amplifier output is used as an input to flip flop 18 which divides the frequency in half and provides alternate positive pulses (G and $\overline{G}$) to AND gates 12 and 16 respectively.

AND gate 12 produces an output (C) which is applied to the gate electrode of field effect transistor 20. AND gate 16 produces an output (S) which is applied to the gate of field effect transistor 22, and in addition, ($\overline{S}$) is generated by inverter 26 and then applied to the gate of field effect transistor 24.

A source of constant current 28 is connected to one terminal of field effect transistor 24 so as to be gated through this transistor during the positive outputs of inverter 26 ($\overline{S}$). Simultaneous with the beginning of this pulse, a positive pulse (C) is applied to field effect transistor 20 bringing the voltage of capacitor 30 to ground level. Instead of ground level, capacitor 30 could be brought to some other known reference voltage.

When field effect transistor 20 ceases to conduct, the current from current source 28 is applied to capacitor 30 causing a buildup in its voltage (VC30) as illustrated. The charging of capacitor 30 ceases at the termination of the positive pulse ($\overline{S}$) from inverter 26. At this time a positive pulse (S) from AND gate 16 is applied to the gate of field effect transistor 22 permitting capacitor 30 to charge capacitor 32 through this transistor. At the completion of the pulse (S) to the gate of field effect transistor 22, the pulse (C) is again initiated connecting capacitor 30 to ground through field effect transistor 20. During each cycle therefore (equivalent to two cycles of the input signal), capacitor 30 is charged to a voltage proportional to the duration of the input signal cycle, charges capacitor 32 to a voltage (VC32) approaching this voltage, and is then discharged.

Capacitor 32 constitutes the memory of the system. Several cycles of the system are required before its voltage converges to the voltage of capacitor 30. The addition of power gain at point 34 would reduce to one the number of cycles of the system required for convergence.

If the period of the input signal decreases, capacitor 32 has a voltage higher than that of capacitor 30 so that when field effect transistor 22 is gated, capacitor 32 discharges into capacitor 30 until again the voltage on capacitor 32 becomes equal to the maximum voltage on capacitor 30.

In the event the voltage of capacitor 32 is to be employed to drive some type of dissipative load, power gain amplifier 36 (unity voltage gain) is provided to avoid bleeding the charge from capacitor 32 through output terminals 38. This amplifier also reduces the small but finite time required to transfer the final voltage from capacitor 30 to capacitor 32.

The accuracy of the frequency measurement depends upon having an accurate source of constant current. Constant current source 28 provides this accuracy. Potentiometer 40 is connecter across battery 42 to permit adjustment of the current to a desired value. The voltage tapped off potentiometer 40 is applied to one terminal of differential amplifier 44 which subtracts it from the voltage at terminal 46 of current sensing resistor 48. The difference, if any, is amplified and applied to the gate of field effect transistor 50 so as to maintain the current at the desired value.

Although in this embodiment two cycles of the input signal are required for a conversion cycle of the system, this is not a rigid limitation. What is required for the conversion is a time interval having a known relationship to the period of the input waveform. Such a time interval is conveniently identified by the intersections of the input waveform with the mean value (D.-C. average) of the input wavefore. Therefore, the time interval during which capacitor 30 is charged might be one cycle of the input waveform or some multiple of one cycle. Because of current leakages, etc., the least time interval is selected when measuring long periods (low frequencies); while a multiple of the least time interval would be chosen when measuring short periods. This circuit constquently would not have an upper frequency limit unless there was some requirement that the least time interval be used. If there is a restriction to the least time interval (or say a small multiple of it), the time required to discharge capacitor 30 could limit the upper frequency range. This limitation may not be a practical one since it depends on the capacitance of capacitor 30 and the equivalent resistance through which it is discharged, both of which can be changed over wide limits.

The lower frequency range is limited by the magnitude of leakage currents causing a change in the voltage of capacitor 32. The voltage error which results from such leakage currents can be described as:

$$e=it/c$$

where:

$i$=the leakage current
$t$=the time during which leakage occurs
$c$=the capacitance By using the smallest time interval, this error is reduced, and/or it can be reduced by increasing the capacitance of capacitor 32 so that any error due to leakage current becomes relatively small. In one circuit constructed in accordance with this invention the leakage current was less than $10^{-9}$ amperes (approaching the conductivity of the best insulators). Thus this error becomes negligible for most applications.

While a particular embodiment of a frequency to D.-C. converter has been illustrated and described, it will be obvious that changes and modifications can be made without departing from the spirit of the invention.

What is claimed is:

1. A system for producing a direct voltage having a magnitude which varies in accordance with the frequency of an alternating input signal comprising:

a first capacitor;
first means for bringing said first capacitor to a known voltage level;
a constant current source;
second means for connecting said first capacitor to said constant current source for a predetermined number of cycles of said input signal;
a second capacitor;
third means for connecting said first capacitor to said second capacitor for a time sufficient to bring said capacitors to the same voltage level; and
means for repetitively actuating said first, second, and third means whereby said second capacitor will maintain a voltage proportional to the frequency of said input signal.

2. A system for producing a direct voltage having a magnitude which varies in accordance with the frequency of an alternating input signal comprising:

a first capacitor;
a reference voltage source;
a first field effect transistor connected between said first capacitor and said reference voltage source;
a constant current source;
a second field effect transistor connected between said first capacitor and said constant current source;
a second capacitor;
a third field effect transistor connected between said first and second capacitors;
means for first applying a gating signal to the gate of said first field effect transistor for a time sufficient to bring said first capacitor to the level of said reference voltage;
means for second applying a gating signal to the gate of said second field effect transistor for the duration of a predetermined number of cycles of said input signal;
means for third applying a gating signal to the gate of said third field effect transistor for a time sufficient to bring said capacitors to the same voltage level; and
means for repetitively generating said first, second, and third gating signals whereby said second capacitor will maintain a voltage proportional to the frequency of said input signal.

3. A system for producing a direct voltage having a magnitude which varies in accordance with the frequency of an alternating input signal comprising:

a first capacitor;
a first field effect transistor connected between said first capacitor and ground;
means for applying a gating signal to the gate of said first field effect transistor during a first half cycle of said input signal;
a constant current source;
a second field effect transistor connected between said first capacitor and said constant current source;
means for applying a gating signal to the gate of said second field effect transistor for the next cycle of said input signal;
a second capacitor;
a third field effect transistor connected between said first and second capacitors;
means for applying a gating signal to the gate of said third field effect transistor for the next half cycle of said input signal; and
means for repetitively generating said gating signals whereby said second capacitor will maintain a voltage proportional to the frequency of said input signal.

4. A system according to claim 3 wherein said constant current source comprises:

a direct current source;
a potentiometer connected across said source;
a fourth field effect transistor having one terminal connected to said second field effect transistor;
a current sensing resistor having its first terminal connected to one terminal of said potentiometer and its second terminal connected to the other terminal of said fourth field effect transistor; and
a different amplifier having one input connected to the second terminal of said current sensing resistor, a second input connected to the tap of said potentiometer, and its output connected to the gate of said fourth field effect transistor.

References Cited

UNITED STATES PATENTS

| | | | |
|---|---|---|---|
| 2,851,600 | 9/1958 | Brett | 328—140 X |
| 3,333,195 | 7/1967 | Sells et al. | 324—111 X |
| 3,342,341 | 7/1968 | Burns | 307—304 X |
| 3,393,325 | 7/1968 | Borror et al | 307—251 X |

OTHER REFERENCES

Measurement Technology, "Semiconductor Capacitive Frequency Meter," November 1963, pp. 417–421.

Western Electric Technical Digest No. 7, "Vibration Frequency Monitor," July 1967, p. 39.

JOHN F. COUCH, Primary Examiner
W. H. BEHA, Jr., Assistant Examiner

U.S. Cl. X.R.

307—251; 321—47; 324—78; 328—140